United States Patent
Lobo et al.

(10) Patent No.: US 7,487,423 B2
(45) Date of Patent: Feb. 3, 2009

(54) DECODING METHOD, MEDIUM, AND APPARATUS

(75) Inventors: Austin Lobo, Suwon-si (KR); Sang-rae Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 359 days.

(21) Appl. No.: 11/050,768

(22) Filed: Feb. 7, 2005

(65) Prior Publication Data

US 2005/0204210 A1 Sep. 15, 2005

(30) Foreign Application Priority Data

Feb. 5, 2004 (KR) ................... 2004-7667

(51) Int. Cl.
G06F 11/00 (2006.01)
G01R 31/28 (2006.01)
H04B 17/00 (2006.01)
H03M 13/00 (2006.01)

(52) U.S. Cl. ................. 714/744; 714/715; 714/776; 375/224

(58) Field of Classification Search ............. 714/776, 714/715, 744; 375/224
See application file for complete search history.

(56) References Cited

U.S. PATENT DOCUMENTS

| 5,944,851 | A | 8/1999 | Lee |
| 6,192,073 | B1 | 2/2001 | Reader et al. |
| 6,557,137 | B1 | 4/2003 | Park et al. |
| 2002/0157044 | A1* | 10/2002 | Byrd ................. 714/703 |
| 2003/0101408 | A1* | 5/2003 | Martinian et al. ........... 714/776 |
| 2003/0196158 | A1* | 10/2003 | Leung ................. 714/776 |
| 2003/0206557 | A1* | 11/2003 | Chen et al. ............. 370/474 |

(Continued)

FOREIGN PATENT DOCUMENTS

CN 1190292 8/1998

(Continued)

OTHER PUBLICATIONS

Error Detection in the Presence of Synchronization Loss by Hellman, M. This paper appears in: Communications, IEEE Transactions on [legacy, pre-1988] Publication Date: May 1975 vol. 23, Issue: 5 On pp. 538-539 ISSN: 0096-2244.*

(Continued)

Primary Examiner—Cynthia Britt
(74) Attorney, Agent, or Firm—Staas & Halsey LLP

(57) ABSTRACT

A decoding method, medium, and apparatus capable of preventing error propagation and implementing parallel processing. A decoding method includes comparing encoding information with decoding information at synchronization points for detecting a transmission error, and continuing to decode the encoded data if both the encoding and decoding information match, or continuing to decode remaining data located beyond the corresponding synchronization point by limiting a transmission error region to between the corresponding synchronization point and an immediately previous synchronization point, with reference to the encoding information if the encoding and decoding information do not match. Furthermore, the encoded data of a plurality of regions are simultaneously decoded in parallel, with reference to the encoding information of a plurality of synchronization points. Therefore, it is possible to prevent error propagation by limiting the transmission error within a smallest possible length and to reduce a decoding time by using a parallel processing.

23 Claims, 5 Drawing Sheets

U.S. PATENT DOCUMENTS

2004/0153952 A1* 8/2004 Sharma et al. ............ 714/781

FOREIGN PATENT DOCUMENTS

| KR | 1999-66827 | 8/1999 |
|---|---|---|
| KR | 10-316785 | 6/2001 |

OTHER PUBLICATIONS

Arithmetic coding algorithm with embedded channel coding by Elmasry, G.F. This paper appears in: Electronics Letters Publication Date: Sep. 25, 1997 vol. 33, Issue: 20 On pp. 1687-1688 ISSN: 0013-5194 Inspec Accession No. 5733345.*

"Early resynchronization, error detection and error concealment for reliable video decoding" Shaoshuai et al. This paper appears in: Communication Technology Proceedings, 2003. ICCT 2003. International Conference on Publication Date: Apr. 9-11, 2003 vol. 2, On pp. 1133-1136 vol. 2 ISBN: 7-5635-0686-1 Inspec Accession No. 7824360.*

Chinese Office Action dated Dec. 29, 2006 and issued in correspondence to the Chinese Patent Application No. 2005100054002.

* cited by examiner

CAPTURED ENCODING INFO

|  | ENCODING STATUS INFO | | BIT STREAM OFFSET | ADDITIONAL INFO |
|---|---|---|---|---|
| S0 | Interval 0 | Offset 0 | bitOffset 0 | Additional 0 |
| S1 | Interval 1 | Offset 1 | bitOffset 1 | Additional 1 |
| S2 | Interval 2 | Offset 2 | bitOffset 2 | Additional 2 |
| S3 | Interval 3 | Offset 3 | bitOffset 3 | Additional 3 |

DECODING METHOD, MEDIUM, AND APPARATUS

CROSS-REFERENCE TO RELATED APPLICATIONS

This application claims the benefit of Korean Patent Application No. 2004-7667, filed on Feb. 5, 2004, in the Korean Intellectual Property Office, the disclosure of which is incorporated herein in its entirety by reference.

BACKGROUND OF THE INVENTION

1. Field of the Invention

The present invention relates to a data decoding method, medium, and apparatus and more particularly, to a decoding method, medium, and apparatus capable of preventing error propagation and implementing parallel processing.

2. Description of the Related Art

Data compression is indispensable for effectively transmitting a huge amount of data, such as video or audio, and storing similar data in smaller memory spaces. For data compression, various standards have been developed, such as joint photographic experts group (JPEG), moving picture experts group (MPEG)-1, MPEG-2, MPEG-4, H.261, H.263, H.264, and so on. In addition, on-going standardization works for data compression includes additional functions, such as virtual reality and authentication. According to conventional data compression standards, an encoder encodes digital image data by segmenting the data into a certain length of blocks.

The encoded data is transmitted to a decoder, and then decoded according to the same standard that was used to encode it. A Huffman's coding and an arithmetic coding are widely used as the encoding/decoding method, with embodiments of the present invention being particularly associated with arithmetic coding.

FIG. 1 illustrates a graph describing a conventional arithmetic coding method, where a message "ABBC#" is compressed. It is assumed that a set of symbols (S) of the message to be encoded includes A, B, C, and #, and probabilities of each symbol are 0.4, 0.3, 0.1, and 0.2, respectively.

To encode the message "ABBC#", a probability reference line extending between 0 and 1 is used. Hereinafter, this probability reference line is referred to as an interval. To encode the first symbol A, a range corresponding to a probability interval (0, 0.4) of the symbol A is used as a new interval for encoding the next symbol, and the encoding value of the symbol A is encoded as a code word represented as a floating point number positioned on the interval. Similarly, the subsequent symbols, B, B, C, and # are represented as (0.16, 0.28), (0.208, 0.244), (0.2332, 0.2368), and (0.23608, 0.2368), respectively. As a result, the entire message, ABBC#, is encoded as a floating point number, 0.23608. In this case, a code word represented by a floating point number having a bit stream length determined by the smallest interval of each symbol is called an offset. From the viewpoint of a decoder, the encoded symbol can be decoded by using the interval and the offset.

In the arithmetic coding method described above, the encoding is implemented by using a code word represented by a floating point number determined based on where the corresponding symbol is positioned on the probability reference line extending between 0 and 1, according to its probability. The encoded code word is delivered to the decoder as a code word represented by a floating point number having a bit stream length determined by the smallest interval of each symbol. Hereinafter, the code word is referred to as an offset.

In other words, if the interval and the offset is defined, the corresponding message can be encoded as a code word represented by a particular floating point number, and the encoded code word is transmitted to the decoder and then decoded according to the same principle. Hereinafter, a pair of the interval and the offset, (interval, offset), of the encoding is referred to as encoding status information, and a pair of the interval and the offset, (interval, offset), of the decoding is referred to as decoding status information.

In this case, the problem is an error occurring during the transmission of encoded data. FIG. 2 illustrates a slice diagram describing a method of processing a transmission error according to a conventional decoding method.

In FIG. 2, an example of a slice, a unit of data encoded according to an arithmetic coding method, is illustrated. The slice includes a header and a plurality of macro blocks. A conventional decoder detects an exceptional state D or an undefined state caused by a transmission error E in bits or packets during decoding the encoded slice, and then processes the error. In other words, in a limited case that the exceptional state is detected during the decoding, the decoder determines that a transmission error occurs, so that the corresponding entire slice is discarded. In this case, the discarded slice includes the macro blocks (from the start point of the slice to a position E) which have been accurately decoded without any transmission error, the macro blocks (behind a position D) which are to be decoded behind the errored macro block, as well as the macro blocks (from a position E to a position D) having the transmission error.

In other words, since a conventional decoder does not include a method of detecting an accurate position (E) of the transmission error, even a single bit of error can propagate to the entire slice. Therefore, the entire slice, including remaining macro blocks that have not been decoded and which may have no error, should be discarded. Particularly, such a transmission error can be an important problem in applications, such as video or audio streaming services, because retransmission becomes difficult to implement.

On the other hand, according to conventional decoding methods, the decoding is sequentially performed from the start point of the slice to the end along the dashed arrow line, as shown in FIG. 2. Particularly, according to a context adaptive arithmetic coding, a probability of a neighboring data that has been already decoded is used to encode the next data. In addition, according to a context adaptive binary arithmetic coding (CABAC), an identical probability table is used when an encoder or a decoder starts to encode or decode data, but their probabilities are updated as the encoding or the decoding is progressed. Therefore, the current data cannot be decoded before the previous data is decoded because encoding status information (interval, offset) of the previous data influences the current data. As a result, parallel processing of the decoding cannot be implemented, thereby decreasing the decoding speed.

SUMMARY OF THE INVENTION

Embodiments of the present invention set forth a decoding method, medium, and apparatus capable of preventing error propagation and implementing a parallel processing.

Additional aspects and/or advantages of the invention will be set forth in part in the description which follows and, in part, will be obvious from the description, or may be learned by practice of the invention.

To achieve the above and/or other aspects and advantages, embodiments of the present invention set forth a decoding method, including receiving encoded data and encoding information of at least one synchronization point set at a predetermined period within the received encoded data, obtaining decoding information corresponding to the synchronization point while decoding the encoded data, comparing the encoding information with the decoding information for detecting a transmission error, and continuing to decode the encoded data if the encoding information and decoding information for the one synchronization point match, or continuing to decode the encoded data located beyond the corresponding synchronization point with reference to the encoding information if the encoding information and decoding information do not match by limiting a transmission error region to between the corresponding synchronization point and a previous synchronization point.

The previous synchronization point may be an immediately previous synchronization point, and the transmission error region may be discarded.

In addition, the synchronization point may be used as a reference point for detecting the transmission error, and set in a periodic position in a unit of at least one macro block of the encoded data.

Further, the encoding information may be received apart from the encoded data by way of additional information. Similarly, the additional information may be supplementary enhancement information raw byte sequence payload (SEI-RBSP) for the encoded data.

The encoding information and the decoding information, according to an arithmetic coding, may also include an interval which is a probability reference line of the data to be decoded, an offset which is a code word represented by a floating point number having a bit stream length determined by a smallest interval of the decoding data, and/or a bit stream offset which functions as a start point of the decoding. The encoding information and the decoding information, according to a context or probability adaptive arithmetic coding, may also include additional information on the context or the probability.

To achieve the above and/or other aspects and advantages, embodiments of the present invention set forth a decoding apparatus including a decoding unit receiving and decoding encoded data, and an error detection/processing unit comparing decoding information, of at least one synchronization point set at a predetermined period within the received encoded data, with encoding information, of a corresponding synchronization point, to detect a transmission error in the decoded data and controlling the decoding unit to continue to decode the encoded data if the encoding and decoding information match or to continue to decode encoded data beyond the corresponding synchronization point with reference to the encoding information received, apart from the encoded data, if both the encoding and decoding information do not match, by limiting an errored region to between the corresponding synchronization point and a previous synchronization point.

The previous synchronization point may be a immediately previous synchronization point, and the errored region may be discarded.

To achieve the above and/or other aspects and advantages, embodiments of the present invention set forth a decoding method, including receiving encoded data and encoding information for at least one synchronization point, set at a predetermined period within the received encoded data, to detect a transmission error and loading the received encoding information corresponding to a start point of slice data of the received encoded data and each synchronization point, and simultaneously decoding the encoded data located between each synchronization point in parallel, with reference to the encoding information.

A number of synchronization points may be set by subtracting one from a number of units by which the decoder can simultaneously decode in parallel, with the synchronization points being set in periodic positions in a unit of at least one macro block of the encoded data. The number of units may also be a number of threads.

In addition, the encoding information and the decoding information, according to an arithmetic coding, may include an interval which is a probability reference line of the decoding data, an offset which is a code word represented by a floating point number having a bit stream length determined by a smallest interval of the decoding data, and/or a bit stream offset which functions as a start point of the decoding. Similar to above, the encoding information and the decoding information, according to a context or probability adaptive arithmetic coding, may further include additional information on the context or the probability.

To achieve the above and/or other aspects and advantages, embodiments of the present invention set forth a decoding apparatus, including a decoding unit receiving and decoding encoded data, and an error detection/processing unit receiving encoding information, of at least one synchronization point set at a predetermined period within the received encoded data, to detect a transmission error, and controlling the decoding unit to simultaneously decode encoded data between each synchronization point in parallel, with reference to the received encoding information corresponding to a start point of a slice of the received encoded data and each synchronization point.

To achieve the above and/or other aspects and advantages, embodiments of the present invention set forth a decoding method, including separately receiving encoded data and encoding information, of at least one synchronization point set at a predetermined period within the received encoded data, to detect a transmission error, simultaneously decoding encoded data between each synchronization point in parallel, with reference to the received encoding information corresponding to a start point of a slice of the received encoded data and each synchronization point, and comparing the encoding information with decoding information, obtained for each synchronization point while decoding the encoded data between each synchronization point, and continuing to decode encoded data if corresponding encoding and decoding information match or continue to decode data beyond the corresponding synchronization point, with reference to the encoding information, if the encoding and decoding information do not match, by limiting a transmission error region to between a corresponding current synchronization point and a previous synchronization point.

To achieve the above and/or other aspects and advantages, embodiments of the present invention set forth a medium including computer readable code implementing embodiments of the present invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
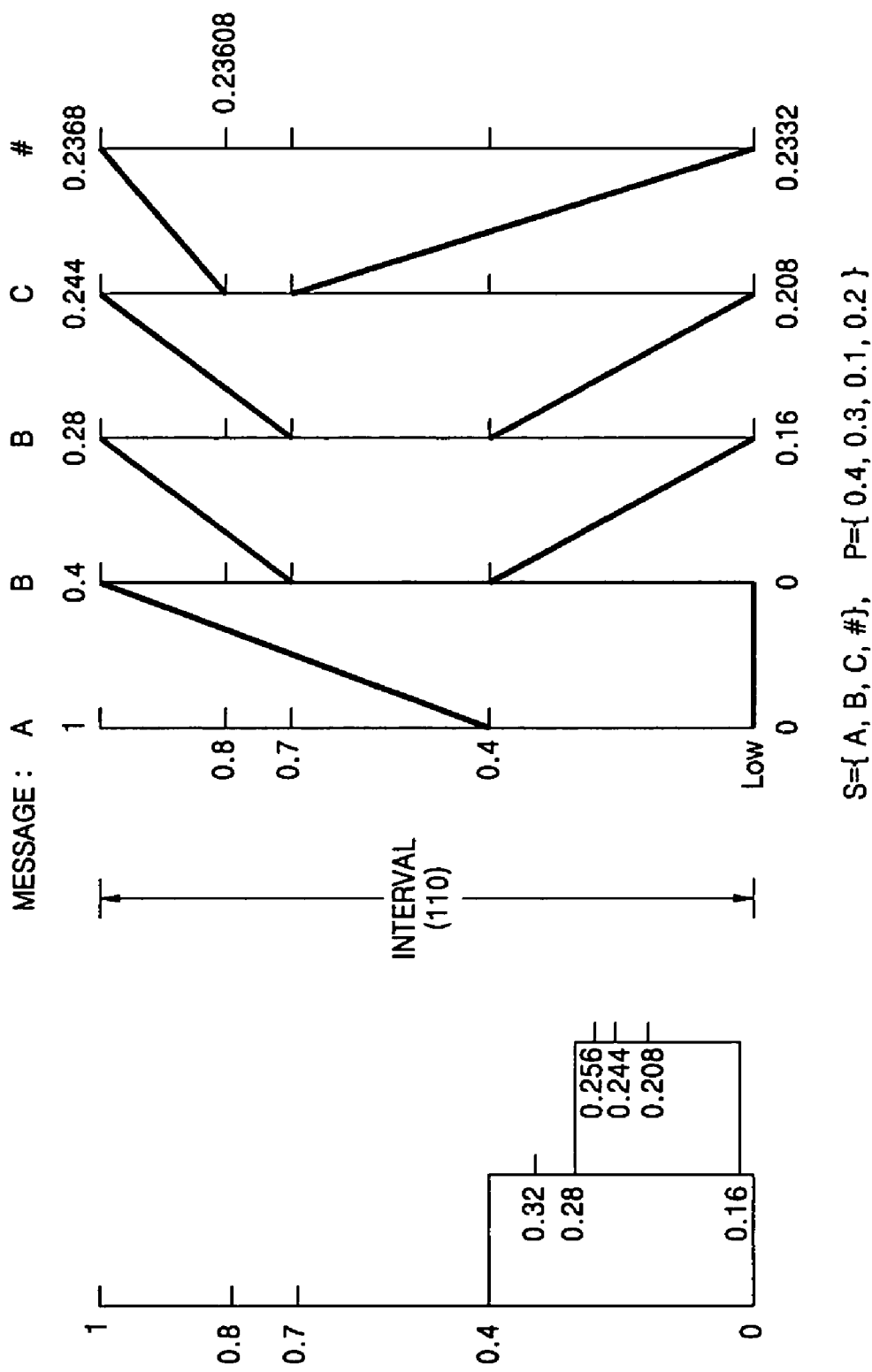
FIG. 1 illustrates a graph describing a conventional arithmetic coding method.
Figure 2:
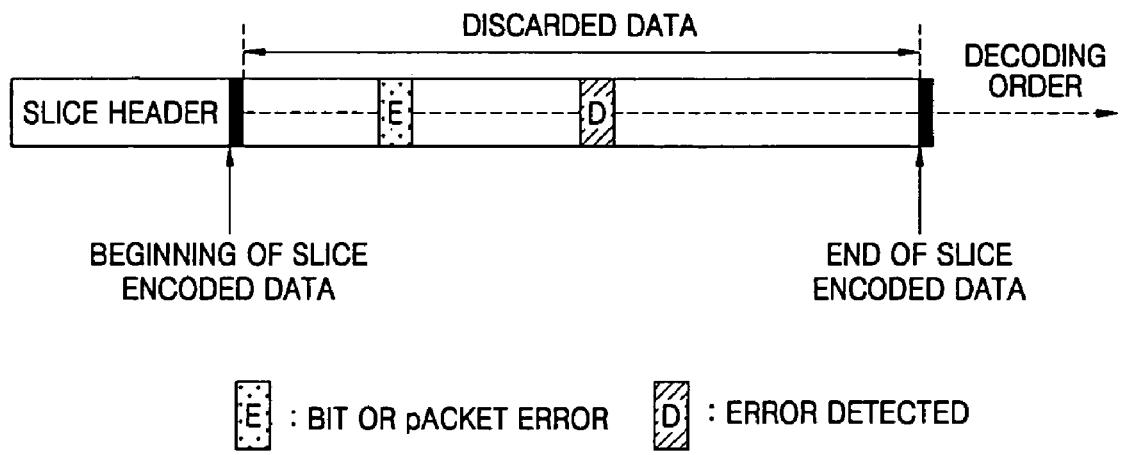
FIG. 2 illustrates a slice diagram describing a method of processing a transmission error when a transmission error occurs, according to a conventional decoding method.

Embodiments of the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will not be repeated.

Figure 3:
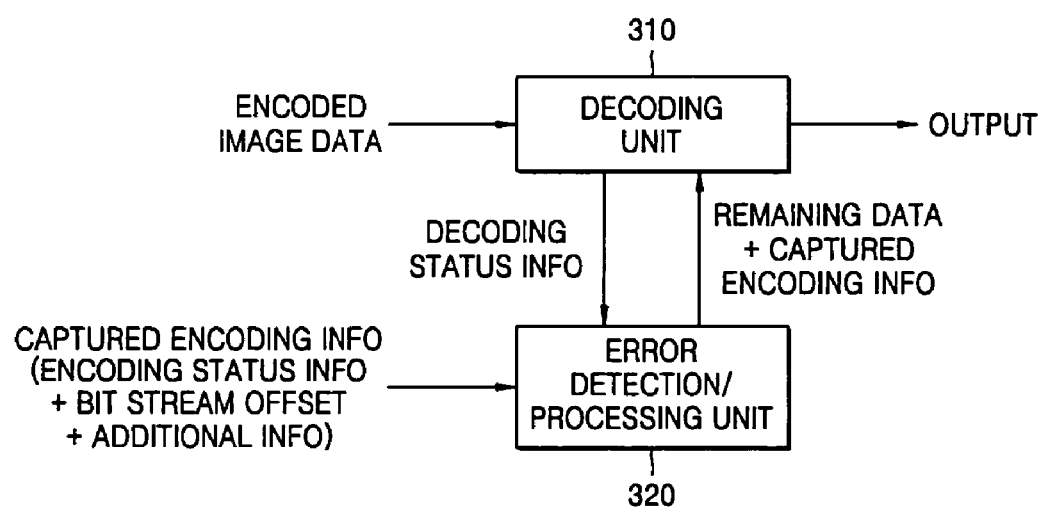
FIG. 3 is a block diagram of a decoding apparatus capable of preventing error propagation and implementing a parallel processing even when a transmission error occurs, according to an exemplary embodiment of the present invention.

FIG. 3 is a block diagram of a decoding apparatus capable of preventing error propagation and implementing parallel processing even when a transmission error occurs, according to an exemplary embodiment of the present invention.

A decoder according to this embodiment of the present invention includes at least a decoding unit 310 and an error detection/processing unit 320.

The decoding unit 310 receives encoded data from an encoder and decodes the data.

The error detection/processing unit 320 detects a transmission error in the decoded data of the decoding unit 310 by comparing decoding status information of a synchronization point (hereinafter, referred to as a sync point) with corresponding encoding status information included in captured encoding information separately received from the encoder, and then processes the decoding. More specifically, in order to detect a transmission error in the decoded data, the error detection/processing unit 320 compares the decoding status information of a plurality of sync points set in predetermined periods with the encoding status information included in corresponding captured encoding information received apart from the encoded image data. If both the corresponding decoding status information and encoding status information is the same, the error detection/processing unit 320 determines that there is no transmission error, and then controls the decoding to be continued. On the contrary, if the two status information are different, the error detection/processing unit 320 determines that a transmission error has occurred, and then controls the decoding to be continued for remaining data by limiting the transmission error region between the corresponding sync point and a previous sync point, e.g., the immediately previous sync point, and then transmits the captured encoding information separately received and the remaining data to the decoding unit 310.

Now, the captured encoding information according to an embodiment of the present invention will be described in detail.

Figures 4, 5:
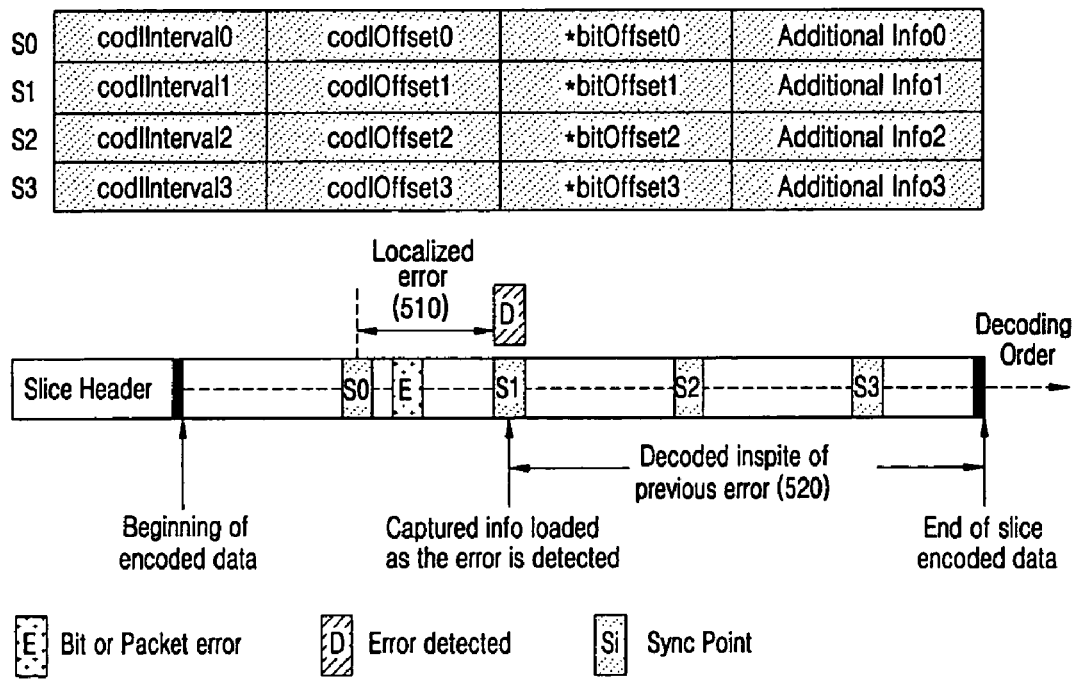
FIG. 4 illustrates an example of captured encoding information separately received to prevent error propagation and implement a parallel processing event when a transmission error occurs, according to another exemplary embodiment of the present invention.
FIG. 5 illustrates an example of a slice format for describing a decoding method capable of preventing error propagation even when a transmission error occurs, according to an embodiment of the present invention.

FIG. 4 illustrates an example of captured encoding information, according to an embodiment of the present invention, separately received to prevent error propagation and an implementing of a parallel processing even when a transmission error occurs.

The captured encoding information includes encoding status information, a bit stream offset, and/or additional information.

The encoding information includes intervals and offsets, which are necessary to encode the data of each sync point, Si, including S0, S1, S2, and S3, for example, into floating point numbers according to an arithmetic coding method.

The bit stream offset represents a bit stream position of a corresponding sync point from the start point of the encoded slice. The encoding can be restart from the position indicated by the bit stream offset with reference to encoding status information including the corresponding interval and offset.

The additional information includes context information for an adaptive arithmetic coding and/or adaptive probability information. If the decoder can implement an arithmetic coding method with reference to only the encoding status information, the additional information may not be incorporated. That is, if the context or probability adaptive arithmetic coding method is used, the additional information can be incorporated into the captured encoding information. However, if other arithmetic coding methods, capable of decoding data without the additional information, are used, the additional information cannot be incorporated. Therefore, the additional information may be incorporated depending on the arithmetic coding method.

The captured encoding information is delivered to the decoder according to a corresponding arithmetic coding method apart from the encoded data slice. In other words, the encoder separately encodes the captured encoding information for data to be encoded of the sync point during encoding of the data and then delivers the captured encoding information to the decoder. For example, according to the H.264 standard, the encoding status information can be delivered to the decoder by way of a supplementary enhancement information raw byte sequence payload (SEI-RBSP). The decoder receives the captured encoding information from the encoder, apart from the encoded data. Meanwhile, the decoder obtains the decoding status information, including the interval and the offset corresponding to the sync point, for every certain period while decoding the received encoded data, and then compares the decoding status information with the encoding status information.

The former includes intervals and offsets calculated by the encoder, with respect to image data in each sync point before the transmission, and the latter includes intervals and offsets calculated by the decoder, with respect to image data at the same position after the transmission. Therefore, if both the encoding status information and the decoding status information are the same, it means that encoded data has been accurately transmitted without an error during the transmission.

On the contrary, if the encoding status information and decoding status information are different, it means that a transmission error has occurred. According to an exemplary embodiment of the present invention, the aforementioned comparison can be performed at every predetermined period, and then a region having a transmission error can be limited between the an immediately previous sync point S(i−1) and the corresponding sync point Si if the comparison results of the encoding status information and the decoding status information show both the two status information to be different. Therefore, the decoding of the remaining data can be continued from the position corresponding to the bit stream offset, with reference to the bit stream offset and the encoding status information included in the captured encoding information of the corresponding sync point. Since the captured encoding information received apart from the encoded data is not influenced by the transmission error, the decoding can be accomplished without error by using the offsets and the intervals included in the encoding status information, and the corresponding position where the decoding should be restarted can be determined with reference to the bit stream offset.

Accordingly, it is possible to prevent a transmission error from propagating to the entire slice by limiting the region having the transmission error to be the smallest possible length, and to continue to decode data without discarding the remaining data that has not been decoded and may have any errors.

Meanwhile, the sync point Si is used as a reference point to detect the transmission error. In any image data, the sync points can be set at periodic positions in a unit of at least one macro block, for example. From the viewpoint of the encoder, the sync point specifies a data position where the captured encoding information of the slice data, encoded according to an arithmetic coding method, is transmitted to the decoder by way of of, for example, the SEI-RBSP. A plurality of sync points can be set in order to determine which slice has a transmission error. For example, the sync point can be set for every macro block except the first one in a slice. According to the H.264 standard, positions of decoding a flag, mb_skip_flag, in each macro block can be set as the sync points in P, B, or SP slices. For another example, positions of decoding a flag, $mb\_field_{13}$ decoding_flag, or a flag, mb_type, can be set as the sync points in I or SI slices. Otherwise, several macro blocks can be combined to be used as units for the sync point. That is, the aforementioned positions of the synchronization points are just exemplary, and actually may not have a fixed period. Preferably, the positions of synchronization points can be appropriately modified to obtain a meaningful error detection period as well as to not limit overhead in the captured encoding information.

Now, a decoding method capable of preventing transmission error propagation, according to another embodiment of the present invention will be described in detail.

FIG. 5 illustrates an example of a slice format describing a decoding method capable of preventing error propagation even when a transmission error occurs, according to an embodiment of the present invention.

The slice includes a header and a plurality of macro blocks. From the start point of the slice to the end, the sync points S0, S1, S2, and S3 are set at every predetermined period. While decoding the data along the dashed arrow line, the decoder obtains a pair (codIInterval, codIOffeet) representing the interval and the offset, as decoding status information, of the corresponding position when each designated sync point S0, S1, S2, and S3 is reached. Then, the decoder compares the decoding status information with a pair (Interval, Offset) representing the interval and the offset, as encoding status information, of the same position. As illustrated in FIG. 4, the encoding status information can be separately received.

Supposing that a transmission error occurs at the E position, the transmission error would propagate to the entire slice, according to properties of the aforementioned arithmetic coding, and would not be detected until the position S1 is reached. According to an embodiment of the present invention, when the sync point S1 is reached, the decoding status information of the sync point S1 is compared with the encoding status information of the captured encoding information. If both the decoding status information and the encoding status information are the same, it can be determined that the decoding has been appropriately performed without an error, and then the decoding can proceed. However, if there is a transmission error (E) as shown in the figure, it will be determined that the decoding status information (codIInterval, codIOffset) is different from the encoding status information (Interval, Offset), so that the error (E) will be detected in the sync point S1.

Meanwhile, in order to prevent the error from further propagating, the captured encoding information of the corresponding position S1, where the error has been detected, is loaded. From the bit stream offset position, bitOffset, identified by the captured encoding information of the corresponding position S1, the decoding for the remaining data 520 can be continued with reference to the encoding status information, (Interval, Offset). In addition, the errored region can be limited within a region 510 positioned between the previous sync point S0 and the current sync point S1, and only the region 510 has to be discarded.

The aforementioned decoding method capable of preventing error propagation can be summarized as follows.

Figure 6:
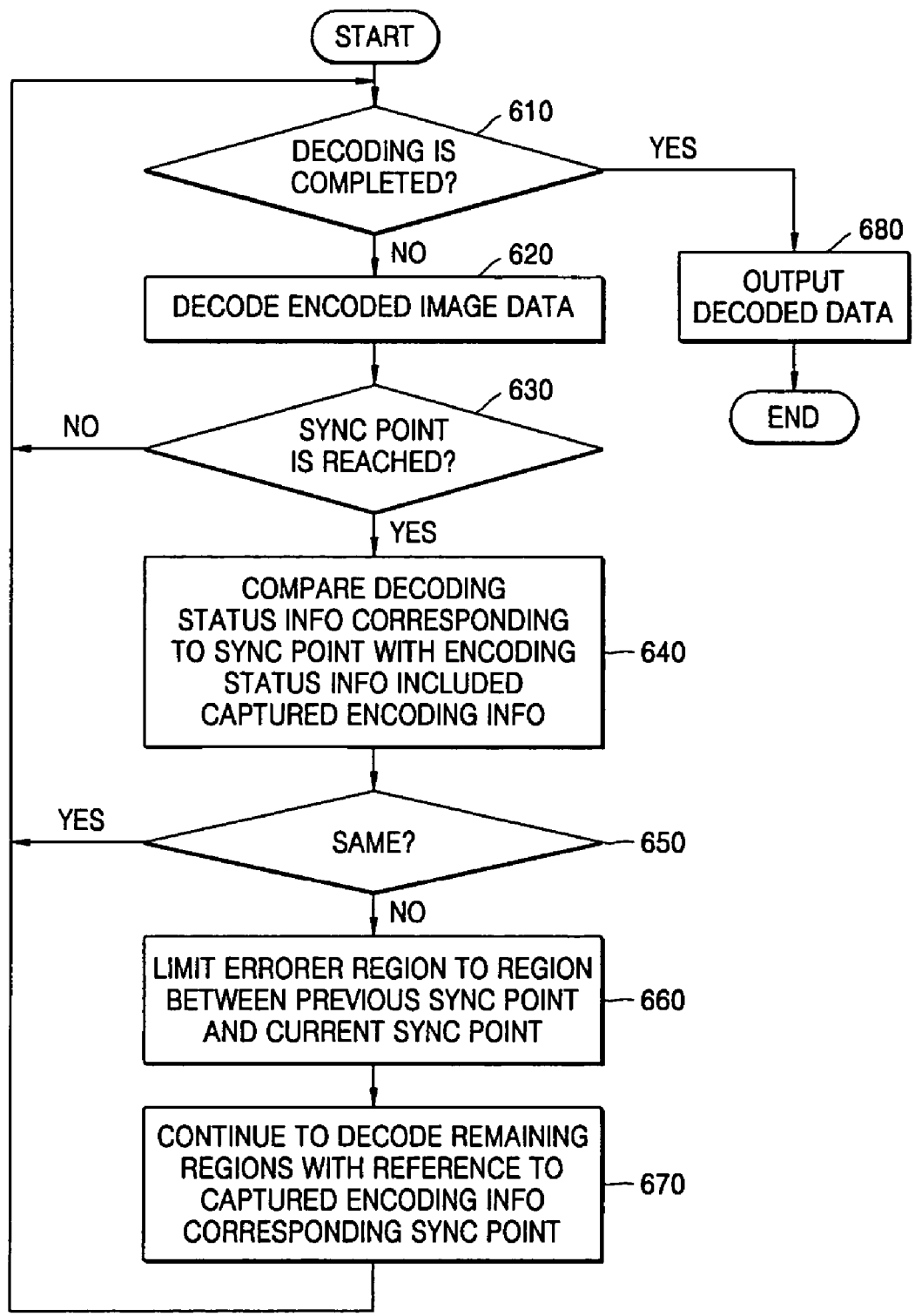
FIG. 6 is a flow chart describing a decoding method capable of preventing error propagation event when a transmission error occurs, according to an embodiment of the present invention.

FIG. 6 is a flow chart describing a decoding method capable of preventing error propagation when a transmission error occurs, according to an embodiment of the present invention.

A decoding method according to an embodiment of the present invention includes comparing encoding information with decoding information by receiving encoded data and the encoding information of at least one sync point set in every predetermined period and obtaining the decoding information corresponding to the sync point while decoding the encoded data, and continuing to decode data if both the encoding and decoding information are the same, or continuing to decode remaining data behind the corresponding sync point with reference to the encoding information by limiting a transmission error region to between the corresponding sync point and an immediately previous sync point and if both the encoding and decoding information are different.

More specifically, referring to FIG. 6, until the decoding is completed (operation 610), the received encoded data is decoded by using predetermined units, such as a macro block (operation 620). If a synchronization point is reached (operation 630), during decoding the data, the decoding status information of the corresponding synchronization point is compared with the encoding status information included in the captured encoding information (operation 640). As a result of the comparison, if both the encoding and decoding information are the same, the decoding proceeds because it is thereby determined that there is no transmission error (operation 610). If the encoding and decoding information are different, it is thereby determined that an error has occurred, and the transmission error region is selectively discarded by limiting the transmission error region to between the previous sync point and the current sync point, as the errored region (operation 660). In addition, the decoding can be continued for the remaining region behind the current sync point with reference to the captured encoding information corresponding to the current sync point (operation 670). If the decoding is completed (operation 610), the decoded data can then be output to a display device (operation 680).

Now, a decoding method capable of implementing a parallel processing, according to another embodiment of the present invention will be described.

Figure 7:
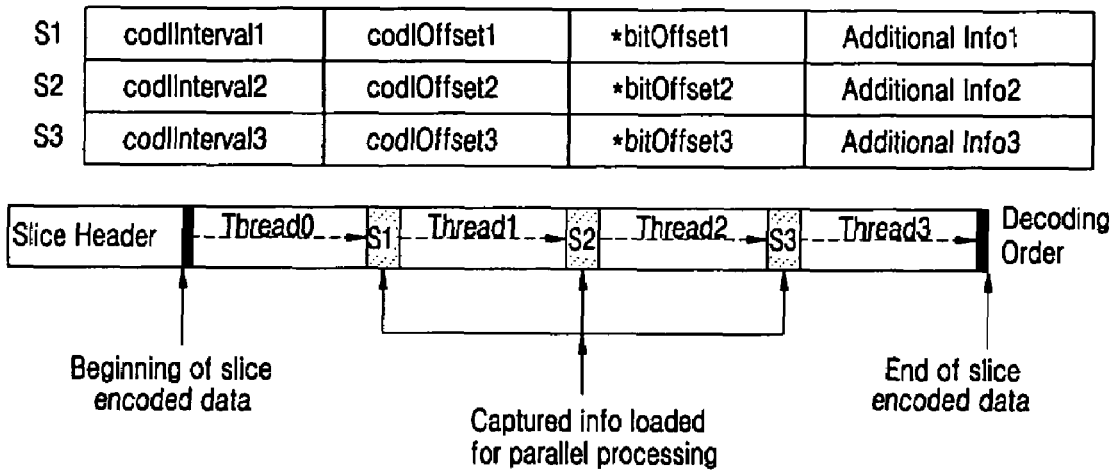
FIG. 7 illustrates an example of a slice format describing a decoding method capable of implementing a parallel processing, according to another exemplary embodiment of the present invention.

FIG. 7 illustrates an example of a slice format describing a decoding method capable of implementing parallel processing, according to another embodiment of the present invention.

The slice includes a header and a plurality of macro blocks. From the start of the slice to the end, sync points S0, S1, S2, and S3 are set at predetermined periods. The regions between each sync point are defined as threads. Since there are three sync points S1 through S3 in the figure, four threads Thread0 through Thread3 are provided. That is, (n+1) threads are provided for n sync points.

The first thread Thread0 is decoded in a parallel manner with the remaining threads Thread1, Thread2, and Thread3, with reference to encoding information included in initialization information of a start point of the slice, after the decoder is initialized. The remaining threads Thread1, Thread2, and Thread3 are to be simultaneously decoded in a parallel manner by loading the captured encoding information separately received and included in each sync point. The start point of the decoding is specified by the bit stream offset bitOffset1, bitOffset2, and bitOffset3 in each captured encoding information. In other words, the threads can be simultaneously and individually decoded in a parallel manner by loading the captured encoding information for the start point of the slice and for each sync point. The number of the sync points is determined by the number of the threads, and may be assigned as an optimal number based on the extent supported by the decoder. Typically, (n−1) sync points can be set for a decoder supporting n threads.

The aforementioned decoding method capable of implementing a parallel processing, with reference to the captured encoding information, can be summarized as follows.

Figure 8:
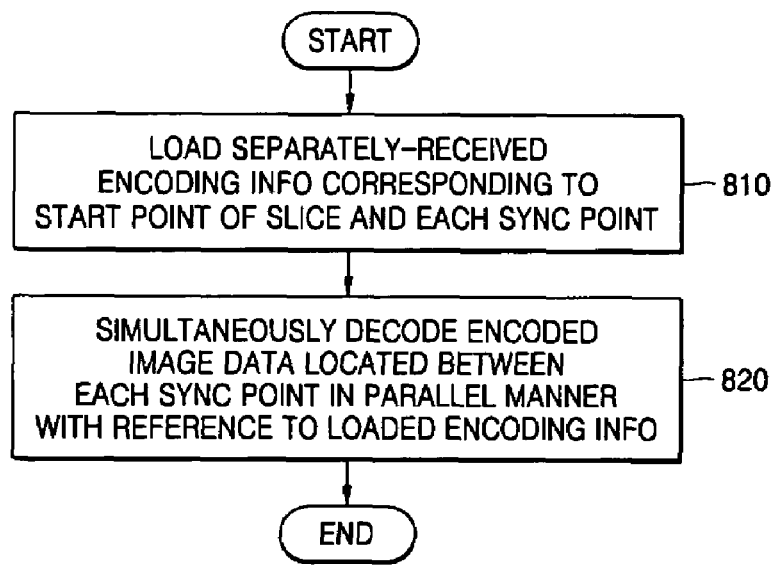
FIG. 8 is a flow chart describing a decoding method capable of implementing a parallel processing, according another embodiment of the present invention.

FIG. 8 is a flow chart describing a decoding method capable of implementing a parallel processing, according another embodiment of the present invention.

A decoding method according to the present invention includes receiving encoded data and encoding information of at least one sync point at predetermined periods, for detecting a transmission error, and loading the received encoding information corresponding to a start point of the slice data and at each sync point, and simultaneously decoding the encoded data between each sync point in a parallel manner with reference to the encoding information.

More specifically, referring to FIG. 8, an arithmetic decoding engine can be initialized when the decoding for a slice is initiated. Then, the encoded data in each thread (from the first thread to the nth thread) between each sync point can be simultaneously decoded in a parallel manner, with reference to the captured encoding information corresponding to the start point of the slice and each sync point (operation 820).

In other words, the decoding according to the arithmetic coding method can be simultaneously processed in a parallel manner with reference to the encoding status information included in the captured encoding information received separately for each sync point, and a current decoding position in the entire slice can be designated with reference to the bit stream offset included in the captured encoding information.

Until now, embodiments of the present invention have been described as preventing transmission error propagation with reference to the captured encoding information and a decoding method capable of implementing a parallel processing with reference to the captured encoding information. In both the operations, the captured encoding information is used. Therefore, a decoding method, medium, and apparatus capable of preventing error propagation and implementing a parallel processing can be provided by combining the two operations. Such a combination will be readily recognized by those skilled in the art, and thus their detailed descriptions will not be repeated.

In addition, however the aforementioned embodiments are described by exemplifying a case that a bit error occurs, the present invention may also be extensively applied in units of a packet.

The invention can also be embodied as computer readable code on a medium, e.g., a computer readable recording medium. The medium may be any data storage device that can store/transmit data which can be thereafter read by a computer system. Examples of the medium include read-only memory (ROM), random-access memory (RAM), CD-ROMs, magnetic tapes, floppy disks, optical data storage devices, and carrier waves (such as data transmission through the Internet), for example. The medium can also be distributed over network coupled computer systems so that the computer readable code is stored, transmitted, and/or executed in a distributed fashion.

According to embodiments of the present invention, it is possible to provide a decoding method, medium, and apparatus capable of preventing error propagation and implementing a parallel processing.

Also, it is possible to limit a transmission error region as the smallest possible length between two points specified in captured encoding information, and to continue to decode the remaining data that has not been decoded with reference to the captured encoding information, according to embodiments of the present invention. Therefore, it is possible to minimize influences of errors.

In addition, it is possible to reduce previously required decoding times by simultaneously decoding a plurality of regions in a parallel manner with reference to the captured encoding information, according to embodiments of the present invention.

Furthermore, embodiments of the present invention can be applied in packet units, having the same length in a network.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A decoding method, comprising:
   receiving encoded data and encoding information including information for arithmetic decoding of the encoded data and synchronization information of at least one synchronization point set at a predetermined period within the received encoded data, the encoded data being decodable based upon the information for the arithmetic decoding of the encoded data;
   obtaining decoding information corresponding to the synchronization point, while decoding the encoded data using upon the information of the arithmetic decoding of the encoded data;
   comparing the received information of the synchronization point with the decoding information for detecting a transmission error; and continuing to decode the encoded data if the encoding information and decoding information for the one synchronization point match and continuing to decode the encoded data located beyond the corresponding synchronization point with reference to the encoding information if the encoding information and decoding information do not match by limiting a transmission error region to be between the corresponding synchronization point and a previous synchronization point.

2. The decoding method of claim 1, the previous synchronization point being an immediately previous synchronization point.

3. The decoding method of claim 1, the transmission error region being discarded.

4. A computer readable medium structure comprising computer readable code to implement the method of claim 1.

5. The decoding method of claim 1, the synchronization point being used as a reference point for detecting the transmission error, and being set in a periodic position in a unit of at least one macro block of the encoded data.

6. The decoding method of claim 1, the information for arithmetic decoding of the encoded data and obtained decoding information of a corresponding performed arithmetic decoding, comprising an interval which is a probability reference line of the data to be decoded, an offset which is a code word represented by a floating point number having a bit stream length determined by a smallest interval of the decoding data, and/or a bit stream offset which functions as a start point of the decoding.

7. The method of claim 6, the information for the arithmetic decoding of the encoded data and the obtained decoding information, according to a context or probability adaptive arithmetic coding, including additional information on the context or the probability.

8. A decoding method, comprising:
receiving encoded data and encoding information of at least one synchronization point set at a predetermined period within the received encoded data;
obtaining decoding information corresponding to the synchronization point while decoding the encoded data;
comparing the encoding information with the decoding information for detecting a transmission error; and
continuing to decode the encoded data if the encoding information and decoding information for the one synchronization point match, or continuing to decode the encoded data located beyond the corresponding synchronization point with reference to the encoding information if the encoding information and decoding information do not match by limiting a transmission error region to between the corresponding synchronization point and a previous synchronization point,
the synchronization point being used as a reference point for detecting the transmission error, and being set in a periodic position in a unit of at least one macro block of the encoded data.

9. The decoding method of claim 1, the encoding information being received apart from the encoded data by way of additional information.

10. The method of claim 9, the additional information being supplementary enhancement information raw byte sequence payload (SEI-RBSP) for the encoded data.

11. A decoding method, comprising:
receiving encoded data and encoding information of at least one synchronization point set at a predetermined period within the received encoded data;
obtaining decoding information corresponding to the synchronization point while decoding the encoded data;
comparing the encoding information with the decoding information for detecting a transmission error; and
continuing to decode the encoded data if the encoding information and decoding information for the one synchronization point match, or continuing to decode the encoded data located beyond the corresponding synchronization point with reference to the encoding information if the encoding information and decoding information do not match by limiting a transmission error region to between the corresponding synchronization point and a previous synchronization point,
the encoding information being received apart from the encoded data by way of additional information, and
the additional information being supplementary enhancement information raw byte sequence payload (SEI-RBSP) for the encoded data.

12. A decoding method, comprising:
receiving encoded data and encoding information of at least one synchronization point set at a predetermined period within the received encoded data;
obtaining decoding information corresponding to the synchronization point white decoding the encoded data;
comparing the encoding information with the decoding information for detecting a transmission error; and
continuing to decode the encoded data if the encoding information and decoding information for the one synchronization point match, or continuing to decode the encoded data located beyond the corresponding synchronization point with reference to the encoding information if the encoding information and decoding information do not match by limiting a transmission error region to between the corresponding synchronization point and a previous synchronization point,
the encoding information and the decoding information, according to an arithmetic coding, comprising an interval which is a probability reference line of the data to be decoded, an offset which is a code word represented by a floating point number having a bit stream length determined by a smallest interval of the decoding data, and/or a bit stream offset which functions as a start point of the decoding.

13. The method of claim 12, the encoding information and the decoding information, according to a context or probability adaptive arithmetic coding, including additional information on the context or the probability.

14. A decoding method, comprising:
receiving encoded data and encoding information including information for arithmetic decoding of the encoded data and synchronization information of at least one synchronization point set at a predetermined period within the received encoded data, the encoded data being decodable based upon the information for the arithmetic decoding of the encoded data, with the synchronization information for detecting a transmission error, and loading the received encoding information corresponding to a start point of slice data of the received encoded data and each synchronization point; and
simultaneously decoding the encoded data located between each synchronization point in parallel, with reference to the encoding information.

15. The decoding method of claim 14, a number of synchronization points being set by subtracting one from a number of units by which the decoder can simultaneously decode in parallel, with the synchronization points being set in periodic positions in a unit of at least one macro block of the encoded data.

16. The decoding method of claim 15, the number of units being a number of threads.

17. A computer readable medium structure comprising computer readable code to implement the method of claim 14.

18. A decoding method, comprising:
- receiving encoded data and encoding information for at least one synchronization point, set at a predetermined period within the received encoded data, to detect a transmission error and loading the received encoding information corresponding to a start point of slice data of the received encoded data and each synchronization point; and
- simultaneously decoding the encoded data located between each synchronization point in parallel, with reference to the encoding information,
- the encoding information and the decoding information, according to an arithmetic coding, including an interval which is a probability reference line of the decoding data, an offset which is a code word represented by a floating point number having a bit stream length determined by a smallest interval of the decoding data, and/or a bit stream offset which functions as a start point of the decoding.

19. The decoding method of claim 18, the encoding information and the decoding information, according to a context or probability adaptive arithmetic coding, including additional information on the context or the probability.

20. A decoding method, comprising:
- receiving encoded data and encoding information including information for arithmetic decoding of the encoded data and synchronization information of at least one synchronization point set at a predetermined period within the received encoded data, the encoded data being decodable based upon the information for the arithmetic decoding of the encoded data;
- simultaneously decoding the encoded data between each synchronization point in parallel, with reference to the received encoding information corresponding to a start point of a slice of the received encoded data and each synchronization point; and
- comparing the encoding information with decoding information, obtained for each synchronization point while decoding the encoded data between each synchronization point, and continuing to decode encoded data if corresponding encoding and decoding information match and continuing to decode data beyond the corresponding synchronization point, with reference to the encoding information, if the encoding and decoding information do not match, by limiting a transmission error region to between a corresponding current synchronization point and a previous synchronization point.

21. The method of claim 20, the previous synchronization point being an immediately previous synchronization point.

22. The method of claim 20, the transmission error region being discarded.

23. A computer readable medium structure comprising computer readable code to implement the method of claim 20.

* * * * *

UNITED STATES PATENT AND TRADEMARK OFFICE
CERTIFICATE OF CORRECTION

PATENT NO. : 7,487,423 B2  
APPLICATION NO. : 11/050768  
DATED : February 3, 2009  
INVENTOR(S) : Austin Lobo et al.

It is certified that error appears in the above-identified patent and that said Letters Patent is hereby corrected as shown below:

Column 12, Line 22, change "white" to --while--.

Signed and Sealed this

Twenty-first Day of April, 2009

JOHN DOLL  
*Acting Director of the United States Patent and Trademark Office*